United States Patent [19]
Bishop et al.

[11] Patent Number: 6,019,167
[45] Date of Patent: Feb. 1, 2000

[54] LIQUID IMMERSION COOLING APPARATUS FOR ELECTRONIC SYSTEMS OPERATING IN THERMALLY UNCONTROLLED ENVIRONMENTS

[75] Inventors: Michael Bishop, Kingston; Trevor Zapach; John Moss, both of Ottawa, all of Canada

[73] Assignee: Nortel Networks Corporation, Montreal, Canada

[21] Appl. No.: 08/994,966

[22] Filed: Dec. 19, 1997

[51] Int. Cl.[7] ........................................ F28D 15/00
[52] U.S. Cl. .............................. 165/104.33; 165/104.19; 165/104.26; 165/80.3; 165/80.4; 361/699; 361/689; 361/677
[58] Field of Search .................. 165/80.2, 80.3, 165/104.33, 104.19; 361/677, 689, 699

[56] References Cited

U.S. PATENT DOCUMENTS

| | | | |
|---|---|---|---|
| 1,550,154 | 8/1925 | Faccioli | 165/104.33 |
| 1,780,110 | 10/1930 | Bliss | 165/104.33 |
| 3,489,207 | 1/1970 | Miller | 165/105 |
| 3,741,292 | 6/1973 | Kumar et al. | 165/105 |
| 4,619,316 | 10/1986 | Nakayama et al. | 165/104.33 |
| 4,745,966 | 5/1988 | Avery | 165/104.33 |
| 4,790,370 | 12/1988 | Niggemann | 165/104.33 |
| 5,411,077 | 5/1995 | Tousignant | 165/104.33 |
| 5,529,115 | 6/1996 | Paterson | 165/104.33 |
| 5,842,514 | 12/1998 | Zapach et al. | 165/104.33 |

FOREIGN PATENT DOCUMENTS

| | | | |
|---|---|---|---|
| 53-12541 | 2/1978 | Japan | 165/104.33 |
| 53-25949 | 3/1978 | Japan | 165/104.33 |
| 57-103338 | 6/1982 | Japan | 165/104.33 |
| 59-232448 | 12/1984 | Japan | 165/104.33 |

OTHER PUBLICATIONS

"Chips Immersion Cooled Inside Device Package", Howard W. Markstein, *Electronic Packaging and Production*, Jan. 1993, p. 33.

*Primary Examiner*—Ira S. Lazarus
*Assistant Examiner*—Terrell McKinnon
*Attorney, Agent, or Firm*—Victoria Donnelly; Angela C. de Wilton

[57] ABSTRACT

The invention relates to a passive liquid immersion cooling apparatus for electronic systems operating in thermally uncontrolled environments. The apparatus comprises an external shell, defining a chamber with a plurality of heat dissipating components disposed within the chamber and surrounded by the shell. The components are immersed into a low boiling point dielectric liquid partially filling the chamber. The shell has two portions, an upper portion of the shell adjacent the area above the liquid level which forms a vapor space, and a lower portion of the shell adjacent the liquid. The shell has an external heat transfer structure providing more efficient heat transfer from the upper part of the shell, for example, in the form of external fins extending outward from the shell, and an internal heat transfer structure in the form of internal fins extending inward from the shell and into the chamber. Preferably, the external fins extend along the upper portion of the shell only. The external heat transfer structure provides effective thermal management of the electronic components within the apparatus over a wide outdoor temperature range. Additionally, a cylindrical design of the apparatus provides more reliable sealing and better pressure containment of the apparatus and may include a solar shield. An assembly of cooling apparatus employing the liquid immersion cooling apparatus and additionally comprising a conduction cooling apparatus, a forced convection cooling apparatus, and a solar shield is also disclosed.

14 Claims, 5 Drawing Sheets

LIQUID IMMERSION COOLING APPARATUS FOR ELECTRONIC SYSTEMS OPERATING IN THERMALLY UNCONTROLLED ENVIRONMENTS

FIELD OF INVENTION

The present invention relates to a cooling apparatus for electronic systems, and in particular, to a passive liquid immersion cooling apparatus suitable for operation in thermally uncontrolled environments.

BACKGROUND OF THE INVENTION

A current trend in the industry is the continuing migration of sensitive electronic systems, which currently reside within environmentally controlled buildings, into remote enclosures located in thermally uncontrolled environments. The operating conditions for these remote electronic systems are formidable and significantly more challenging than those faced by central office equipment. Remote equipment must function under a wide range of ambient temperature conditions and endure the added stress of diurnal ambient temperatures and solar cycling. In addition, dust, humidity, pollutants, vibrations from traffic and power surges (including lightning strikes) in these thermally uncontrolled environments conspire to create an environment that will accelerate failure mechanisms in these remote electronic systems.

Further compounding the issue of increased environmental stresses are the demanding reliability requirements faced by these remote systems. By distributing electronic subsystems at remote locations throughout the network, the mean time to repair any one of them will increase in comparison to an equivalent repair to centrally located equipment. This is due to the time required to travel to the site of the failure and the increased time to repair the failure under potentially uncontrolled conditions, (e.g., rain, snow). As a result, remote electronic systems are required to achieve reliability requirements far in excess of those demanded of central office equipment in order to maintain a comparable level of network availability.

The high cost of providing power to remote electronic systems will also tend to discourage the use of active environmental conditioning systems, (e.g., air conditioners, heaters, heat exchangers). These conditioning systems tend to consume large amounts of power and, in many cases, will limit overall system reliability as they are often found to be less reliable than the electronic systems that they were designed to protect.

Another challenge to the reliability of remote electronic systems is the continuing pace of development in the electronics industry that has led to rapid improvements in integrated circuit performance in recent years, with resultant increases in total chip power dissipation and power densities for advanced devices. Industry estimates for the year 2004 forecast that total chip power dissipation for commercial electronic devices of between 40 to 120 Watts with power densities of 50 to 100 $W/cm^2$ will be common.

As a result, thermal management and its influence on system reliability represents one of the most challenging issues in the development of modern cost-effective remote electronic systems.

It is well known that liquid immersion cooling is an effective method of controlling the temperature of electronic systems. Studies of liquid immersion cooling dating back to the 1950's and 60's demonstrated effective thermal control of large electronic devices (e.g., travelling wave tubes and high voltage power supplies). Later, liquid immersion cooling was introduced to various electronic components and immersion cooled chips. Among liquid immersion cooling modules, passive liquid immersion modules tend to be the most reliable, simple in design, and requiring minimum maintenance efforts. In a passive liquid immersion cooling apparatus, electronic components are immersed in a container of a dielectric liquid having a low boiling point, which is usually sealed from ambient atmosphere. The mode of cooling and consequently the heat transfer is dependent on the heat flux at the surface interface between heat generating components and the cooling liquid. For a small heat flux which creates a temperature below the boiling point of the liquid, natural convection takes place. As the heat flux increases the temperature beyond the boiling point of the liquid, nucleate boiling takes place. The nucleate boiling causes vaporization of the liquid immediately adjacent to the hot component. As the vapor bubbles form and grow on the heated surface, they cause intense micro-convection currents. Thus, nucleate boiling gives rise to an increase in convection within the liquid and, as a result, improves the heat transfer between the hot surface and the liquid. As the heat flux increases, film boiling occurs as the number of bubbles increases to the point where they begin to coalesce and the limiting heat flux commonly known as "critical heat flux" is reached. This point is considered as the practical limit for cooling electronics.

The modes of boiling or heat transfer discussed above have proven to be very efficient. For example, U.S. Pat. No. 3,489,207 to Miller, 1970 provides an indoor vapor-cooled electronics enclosures within a rectangular sealed container partially filled with a vaporizable heat exchange fluid to a level, which covers the electronic components that give off most heat during operation, and wherein electronic components giving off less heat are suspended in the container above the liquid level. The liquid contacts all major surfaces of the submerged electronic components and undergoes a boiling condensation cycle to effect heat removal.

U.S. Pat. No. 3,741,292 to Aakalu, 1973 provides a liquid encapsulated module of a parallelepiped shape which contains a plurality of heat generating components mounted on a substrate to which a container is attached in sealed relationship such that the components are exposed to the inside of the container. A low boiling point dielectric liquid partially fills the container and completely covers the components. A vapor space is located above the liquid level within the container. Internal fins extend inward within the container serving as a condenser for the vapours. External fins extend outwardly of the container serving as an air cooled sink for the internal fin condenser.

An article "Chips Immersion Cooled Inside Device Package" by Howard W. Markstein, published in Electronic Packaging & Production, January 1993, p. 33, describes high heat producing chips which are individually cooled in their device package by liquid immersion. The sealed chip cavity is partially filled with a dielectric fluid and a vapor/condensate cycle transfers heat to either a metal bellows cover or a finned cover of ceramic or metal. The immersed chip acts as the evaporator and the cover as the condenser.

However, the references cited above and other known applications of liquid immersion cooling have been designed to efficiently remove heat from electronic systems operating in fixed ambient temperature environments. For thermally uncontrolled operation, such as an outdoor operation, it is necessary to have a cooling apparatus which could be able to provide exploitation over an extended range of temperatures. Firstly, similar to indoor applications, it is necessary for the cooling apparatus, operating outdoors, to remove heat as efficiently as possible at high external ambient temperatures and/or high internal heat dissipations to maintain the temperature of electronic components at a low temperature rise above the ambient temperature. Secondly, it is necessary for the same cooling apparatus, to remove heat at low external ambient temperatures in a less efficient manner to maintain the temperature of the electronic components at a higher temperature rise above the ambient temperature. Additionally, cooling apparatus for outdoor environments must also provide high reliability and efficiency. It will be appreciated, in order to ensure that the cooling apparatus is useful for outdoor applications, it has to be conveniently designed to provide its operation over a wide range of temperatures, to provide reliable sealing, vapor pressure containment, protection from thermal and solar radiation, and assembly and replacement of different types of cooling apparatus.

SUMMARY OF THE INVENTION

It is therefore an object of the invention to provide a cooling apparatus for electronic components suitable for operation in thermally uncontrolled environments.

According to one aspect of the invention there is provided a liquid immersion cooling apparatus for electronic components, suitable for operation in thermally uncontrolled environments, comprising:

a shell having upper and lower portions and defining a chamber within the shell having corresponding upper and lower portions;

the lower portion of the chamber containing a low boiling point dielectric liquid partially filling the chamber, and a plurality of heat dissipating electronic components being immersed in the liquid;

the shell having an external heat transfer structure extending outwardly from the shell and an internal heat transfer structure extending from the shell into the chamber;

the external heat transfer structure being arranged to provide more efficient heat transfer from the upper portion than the lower portion of the shell.

The external and internal heat transfer structures may comprise external and internal fins correspondingly. To provide more efficient heat transfer, the upper portion of the shell may carry more external fins than the lower portion of the shell, the external fins extending along the upper portion of the shell may have larger surface area or larger size. They also may be made from the material with better heat transfer characteristics. Advantageously, the external fins and internal fins extend along the upper portion of the shell only. Additionally, the cooling apparatus may comprise a solar shield surrounding the apparatus to protect the apparatus from solar radiation. The solar shield may comprise a coating to provide predetermined solar thermal radiating characteristics. The chamber of the immersion cooling apparatus is partially filled with a low boiling point liquid, which may be a binary mixture selected to provide an optimal heat flux from the heat generating components with a low pressure build-up within the chamber. Alternatively, the liquid may be a fluorinated fluorocarbon or chlorinated fluorocarbon. Conveniently, the shell of the immersion cooling apparatus is made of extruded aluminium, and the electronic components disposed within the apparatus are mounted upon electronic substrates arranged within the chamber in a vertical manner. Beneficially, the internal fins of the shell extend along the upper portion of the shell only, occupying a space free from the liquid and the components. Conveniently, the shell of the apparatus and the solar shield have a cylindrical shape, with the solar shield coaxially surrounding the apparatus. For a cylindrically shaped apparatus, the external and internal fins may be radial fins. Top and bottom ends of the cylindrical shell, corresponding to the upper and lower portions of the shell, are sealed from ambient atmosphere, with the top end sealed permanently and hermetically, and the bottom end sealed semi-permanently with a removable cap providing sealed feedthroughs for cables.

Advantages of the embodiments of the present invention are as follows.

An external heat transfer structure extending along the upper portion of the shell, which has better heat transfer characteristics than the heat transfer structure extending along the lower portion of the shell, ensures that there is no substantial reduction of heat transfer efficiency at high temperatures, and reduces the heat transfer efficiency at low temperatures, thereby extending the temperature range of operation. For example, by providing external fins on the upper portion of the liquid immersion cooling apparatus only, the electronic components within the apparatus are kept as cool as possible at high temperatures, and as warm as possible at low temperatures. As a result, a range of temperature variations within the apparatus is much narrower than external temperature variations, which ensures suitable working conditions for the electronic components inside the apparatus.

According to another aspect of the invention there is provided a liquid immersion cooling apparatus for electronic components, suitable for operation in thermally uncontrolled environments, comprising:

a cylindrical shell having upper and lower portions and defining a chamber within the shell having corresponding upper and lower portions;

the lower portion of the chamber containing a low boiling point dielectric liquid partially filling the chamber, and a plurality of heat dissipating electronic components being immersed in the liquid;

the shell having an external heat transfer structure extending outwardly from the shell and an internal heat transfer structure extending from the shell into the chamber;

the shell having a top and bottom ends, corresponding to the upper and lower portions of the shell, the ends sealed from ambient atmosphere.

The external and internal heat transfer structures may comprise external and internal fins correspondingly. Beneficially, the external fins extending along the upper portion of the shell provide more efficient heat transfer than the external fins extending along the lower portions of the shell. Alternatively, the external fins extend along the upper portion of the shell only. Additionally, a cylindrical solar shield may surround the apparatus.

An advantage of a cylindrical structure is that it provides a circular cross-section which allows for thinner walls of the apparatus than any other cross-sectional design to contain the same pressure difference developed during the course of operation of the apparatus, thus allowing for a lighter and less expensive containment vessel.

A cylindrical structure also provides a reduced number of surfaces to be sealed in comparison with any other design. Only two circular cross-section surfaces at the top and bottom ends of the cylindrical shell are required to be sealed, thus, providing simpler and more reliable sealing of the apparatus.

According to yet another aspect of the invention there is provided an assembly of cooling apparatus for electronic systems, suitable for operation in thermally uncontrolled environments, comprising:

a) a liquid immersion cooling apparatus, comprising:
  a cylindrical shell having upper and lower portions and defining a chamber within the shell having corresponding upper and lower portions;
  the lower portion of the chamber containing a low boiling point dielectric liquid partially filling the chamber, and
  a plurality of heat dissipating electronic components being immersed in the liquid;
  the shell having an external heat transfer structure extending outwardly from the shell and an internal heat transfer structure extending from the shell into the chamber;
  the shell having a top and bottom ends, corresponding to the upper and lower portions of the shell, the ends sealed from ambient atmosphere;
b) a conduction cooling apparatus mounted to the liquid immersion cooling apparatus and comprising:
  a cylindrical shell having a top and bottom ends, the shell defining a chamber and having an external heat transfer structure extending outwardly from the shell;
  a plurality of heat dissipating electronic components being disposed within the chamber;
  the top and bottom ends of the conduction cooling apparatus being sealed;
c) a forced convection cooling apparatus for cooling both the liquid immersion cooling apparatus and the conduction cooling apparatus.

The conduction cooling apparatus may be mounted to the liquid immersion apparatus beneath the immersion apparatus so as the top end of the conduction apparatus is adjacent the bottom end of the immersion apparatus. The assembly may also comprise one or two forced convection apparatus mounted at one or both ends of the assembly correspondingly. Alternatively, the conduction cooling apparatus may be mounted above the immersion apparatus so as the bottom end of the conduction apparatus is adjacent the top end of the immersion apparatus, with similar mounting of the forced convection apparatus.

The external and internal heat transfer structures of the liquid immersion cooling apparatus may comprise external and internal fins of the immersion apparatus correspondingly, and the external heat transfer structure of the conduction cooling apparatus may comprise external fins of the conduction apparatus.

Beneficially, the external fins of the immersion cooling apparatus, extending along the upper portion of the immersion apparatus shell, provide more efficient heat transfer than the fins extending along the lower portions of the apparatus shell. Alternatively, the external fins of the immersion cooling apparatus extend along the upper portion of the immersion apparatus shell only. Additionally, the assembly may comprise a cylindrical solar shield surrounding the immersion cooling, the conduction cooling, and the forced convection cooling apparatus. Conveniently, the shells of the immersion cooling, the conduction cooling, the forced convection cooling apparatus and the solar shield are coaxial.

Advantages of the assembly comprising several different cooling apparatus assembled together as described above are as follows. A cylindrical design of the apparatus provides not only more reliable sealing and better pressure containment, but also more efficient external fan cooling by the forced convection apparatus.

BRIEF DESCRIPTION OF THE DRAWINGS

Embodiments of the invention will now be described, by way of example, with reference to the accompanying drawings in which.

DESCRIPTION OF THE PREFERRED EMBODIMENTS

Figure 1:
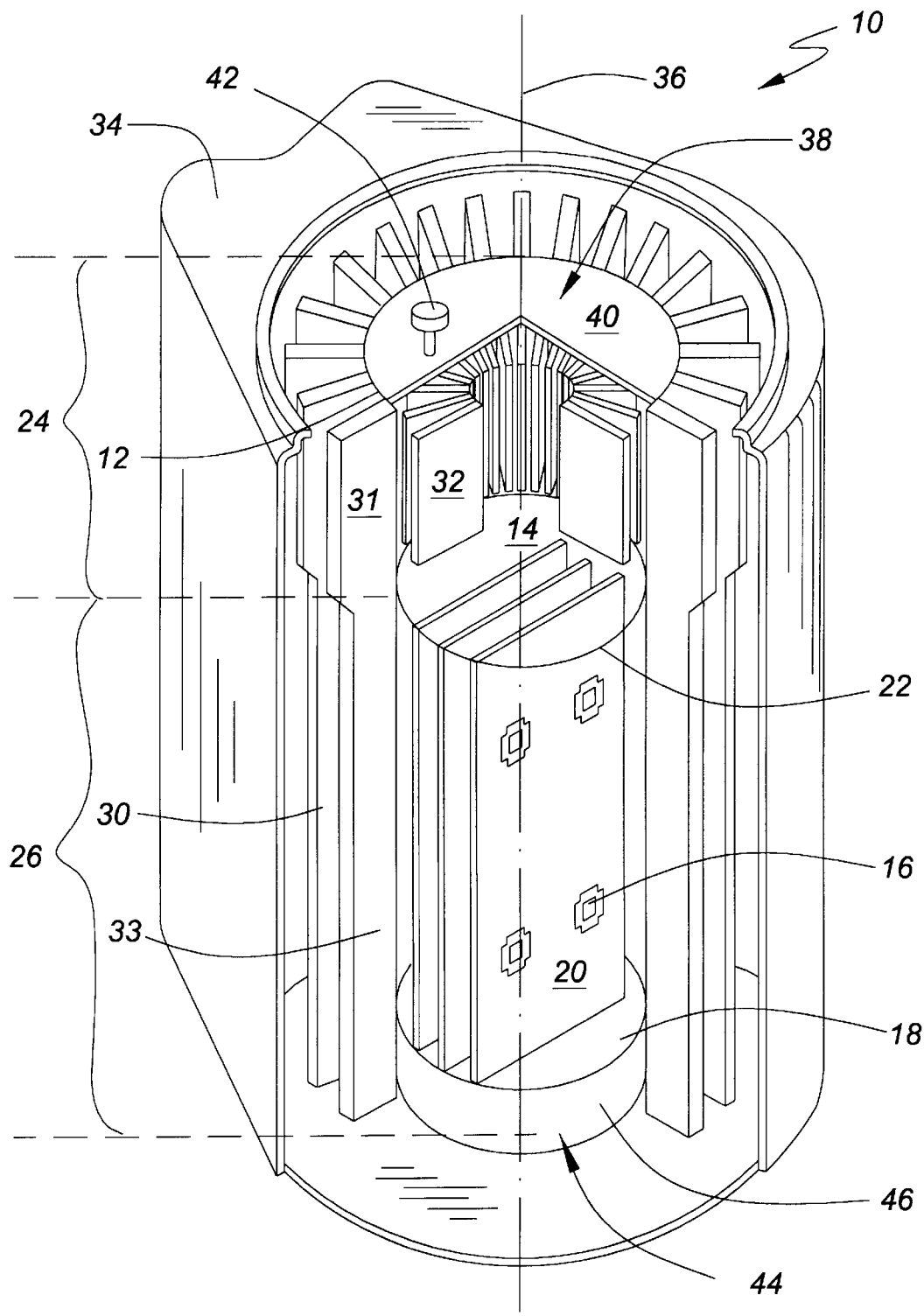
FIG. 1 is a perspective partial cutaway view of a liquid immersion cooling apparatus for electronic components according to a first embodiment of the invention.

As shown in FIG. 1, a liquid immersion cooling apparatus 10 for electronic systems, suitable for operation in thermally uncontrolled environments, according to a first embodiment of the invention, comprises an external shell 12 defining a chamber 14, with a plurality of heat dissipating components 16 disposed within the chamber 14 and surrounded by the shell 12. The components 16 are immersed into a low boiling point dielectric liquid 18 partially filling the chamber. Conveniently, the shell 12 is manufactured from extruded aluminium or any other material with desired heat conductivity and anti-corrosion properties, and the components 16 are mounted upon electronic substrates (circuit boards) 20 arranged within the chamber 14 in a vertical manner. The shell 12 has two portions, an upper portion of the shell 24 adjacent the area above the liquid level 22 which forms a vapor space, and a lower portion of the shell 26 containing the liquid. The shell 12 has an external heat transfer structure made in the form of external fins 30 extending outward from the shell and from the chamber, the fins used to enhance heat transfer from the shell 12 to the surrounding air. The external fins extended along the upper portion of the shell and designated by numeral 31 in FIG. 1 provide better heat transfer characteristics than the fins extending along the lower part of the shell which are designated by numeral 33 correspondingly. The lower portion of the external fins 33 shown in FIG. 1 is narrower than the corresponding portion 31 of the fins carried by the upper portion of the shell. The shell also has an internal heat transfer structure made in the form of internal fins 32 extending inward from the shell and into the chamber, the fins used to enhance heat transfer from the enclosed liquid 18 and its vapor to the shell 12. As shown in FIG. 1, conveniently, the shell 12 is cylindrical, and for this shape of the shell, the external fins 30 and internal fins 32 are advantageously designed as radial fins. Preferably, the internal fins 32 extend along the upper portion of the shell only, occupying the vapor space area. To ensure more efficient heat transfer, the upper portion of the shell carries more external fins than the lower portion of the shell. Alternatively, the shell 12 may have different shape and cross-section (square, rectangular, circular, etc.), depending on applications it is used for and compatibility with other type of cooling apparatus. The external fins 30, including upper and lower portions of the fins 31 and 33 correspondingly, and the internal fins 32 may also have different shape and cross-section. The surface of the external fins extending along the upper portion of the shell may have larger surface and/or bigger size, or they may be made from the material with better heat transfer characteristics. Any other variations in design of the external heat transfer structure providing more efficient heat transfer from the upper portion than the lower portion of the shell will be apparent to those skilled in the art.

The chamber 14 of the immersion cooling apparatus 10 is partially filled with a low boiling point liquid 18. Immersion cooling of electronic components requires the use of chemically stable and inert, non-toxic, non-flammable, low boiling point liquids, possessing a low dielectric constant, high dielectric strength, and high volumetric resistivity. The perfluorinated inert liquids, such as 3M's Fluorinerts, appear to be the most suitable fluids for this application. For the liquid 18, four fully-fluorinated fluorocarbons (FC-72, FC-75, FC-84, FC-87) were evaluated as possible candidates, all of them being suitable for outdoor applications. Alternatively, a binary dielectric liquid or a chlorinated fluorocarbon can be utilized as the liquid 18. A binary liquid consists of a mixture of two dielectric liquids having different characteristics such as boiling points. Thus, a binary liquid can be selected which gives the best heat transfer characteristics for the amount of heat expected to be generated by the apparatus. Also, a binary mixture is selected to give the optimal amount of pressure build-up within the chamber 14.

To protect the apparatus 10 from external thermal and solar radiation and pollutants, the shell 12 is surrounded by a solar shield 34. A surface of the solar shield 34 may have one or more coatings to provide predetermined solar thermal radiating characteristics. Conveniently, for the shell 12 of a cylindrical shape, the solar shield 34 also has a cylindrical shape and coaxially surrounds the apparatus so as main axes of the shell 12 and the solar shield 34 are aligned along the same line, designated by numeral 36 in FIG. 1.

A top end 38 of the shell 12, corresponding to the upper portion 24 of the shell is permanently sealed with a permanent cap 40 which may be welded to the shell 12 in order to maintain a hermetic seal. An over-pressure valve 42 is attached to the permanent cap 40 and designed to release enclosed vapor and any non-condensable gas from within the immersion cooling apparatus 10 in order to maintain an acceptable pressure difference between the environment within the apparatus and the environment external to the apparatus. The valve 42 is preferably designed as a second level safety feature and is not intended to release pressure under the majority of operating conditions.

Figure 2:
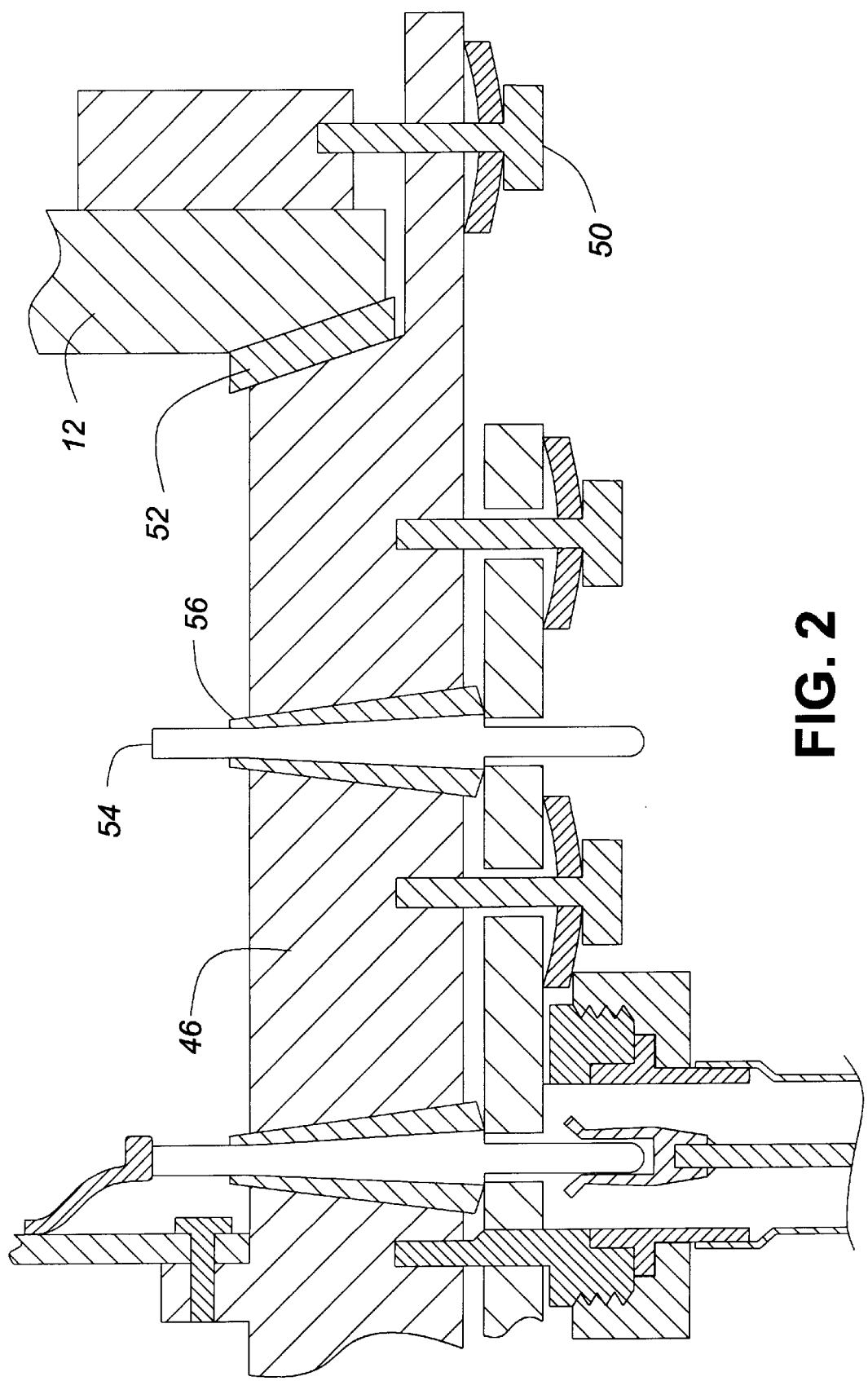
FIG. 2 is a cross-sectional view of a semi-permanent sealing of an immersion cooling shell according to the first embodiment of the invention.

A seal at the bottom end 44 of the shell, corresponding to the lower portion 26 of the shell, is shown in FIG. 2. The bottom end of the shell is semi-permanently sealed with a removable cap 46 that is preferably attached to the shell with bolts 50. The joint between the removable cap 46 and the shell 12 is sealed with a gasket 52 which prevents the loss of enclosed liquid 18 and vapour, and prevents the ingress of contaminants such as dust, small particles, pollutants that may be present external to the apparatus. In addition, the gasket 52 minimizes the ingress of non-condensable gas, liquid water and humidity from the external environment. Power and data cables into and out of the immersion cooling apparatus 10 are terminated at feedthroughs 54 located in the removable cap 46 and sealed with tapered cone insulator gaskets 56 as shown in FIG. 2.

Principles of operation of the liquid immersion cooling apparatus will be illustrated on the apparatus 10 according to the first embodiment.

During operation of the liquid immersion apparatus 10 at high external ambient temperatures and/or high internal heat dissipations, it is desirable to remove heat as efficiently as possible. Under these conditions, the liquid 18 would be boiling, and the major part of the heat is transferred into the vapor space as vapor which then condenses on the walls and internal fins in the upper portion 24 of the apparatus. The major part of the heat is then conducted outwards into the portion of the external heat transfer structure. i.e. external fins 31, extending along the vapor space area in the upper portion of the apparatus. Under these conditions, structure of the external fins, providing better heat transfer characteristics from the upper portion of the shell than the lower portion of the shell, will reduce heat transfer efficiency, but not substantially.

During operation of the liquid immersion apparatus 10 at low ambient temperatures, it is desirable to remove the heat from the apparatus in a less efficient manner in order to maintain the temperature of the electronic components at a temperature that is much higher than the external temperature (for example, when it is −50 C. outside it would be desirable to have the electronics at a temperature of 0 C. rather than −40 C.). Under these conditions, the liquid 18 would not be boiling (vapor is not being generated), and the majority of heat is transferred from the liquid 18 outwards into the portion 33 of the external fins mounted on the lower portion of the apparatus shell. Under these conditions, the structure of the external fins, providing better heat transfer characteristics from the upper portion of the shell than the lower portion of the shell, will reduce the heat transfer efficiency substantially.

Additionally, a cylindrical structure according to the embodiment not only allows for efficient external fan cooling and better sealing, but is also an excellent design for pressure containment. The immersion cooling apparatus must provide sufficient strength to contain pressure differences which develop during the course operation. For pressure containment, a cylinder provides a circular cross-section which allows the wall thickness to be thinner than any other cross-sectional design to contain the same pressure.

Thus, the apparatus described above is suitable for operations in thermally uncontrolled environments, including both indoor and outdoor applications, providing operation of the apparatus within an extended temperature range, with higher reliability and better pressure containment.

Figure 3:
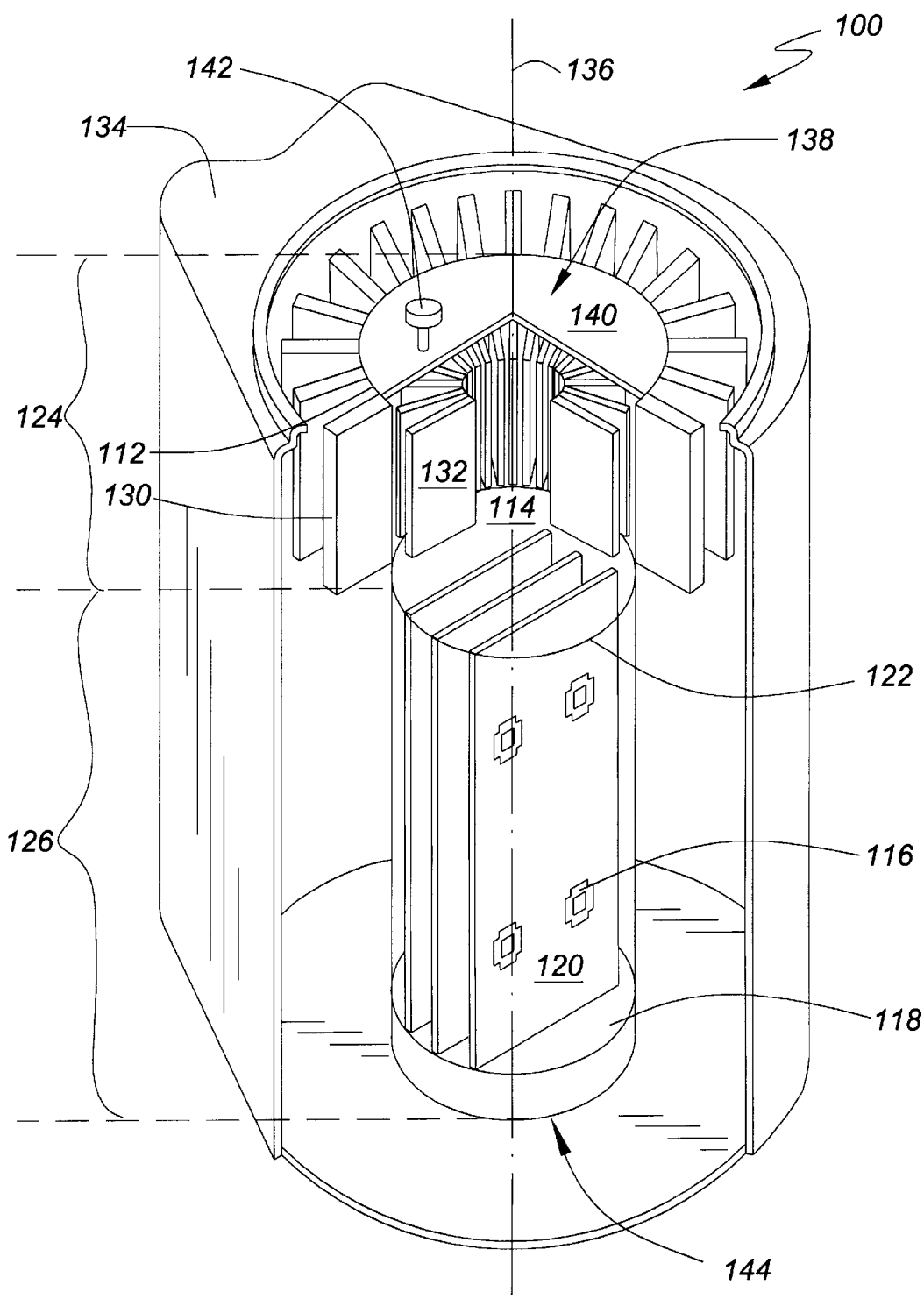
FIG. 3 is a perspective partial cutaway view of a liquid immersion cooling apparatus for electronic components according to a second embodiment of the invention.

A liquid immersion cooling apparatus 100 according to a second embodiment is shown in FIG. 3. The apparatus 100 comprises an external shell 112, defining a chamber 114 with a plurality of heat dissipating components 116 disposed within the chamber 114 and surrounded by the shell 112. The components 116 are immersed into a low boiling point dielectric liquid 118 partially filling the chamber. The shell 112 has two portions, an upper portion of the shell 124 adjacent the area above the liquid level 122 which forms a vapor space, and a lower portion of the shell 126 adjacent the liquid. The shell 112 has an external heat transfer structure including a side external heat transfer structure provided on a side surface area of the shell, the side external heat transfer structure being made in the form of external fins 130 extending outward from the shell and from the chamber, and an internal heat transfer structure made in the form of internal fins 132 extending inward from the shell and into the chamber, the external fins 130 extending along the upper portion 124 of the shell only. Top and bottom ends of the shell, designated in FIG. 3 by numerals 138 and 144 correspondingly, are sealed from ambient atmosphere. To protect the apparatus 100 from external thermal and solar radiation and pollutants, the shell 112 is surrounded by a solar shield 134. The low boiling point dielectric liquid may be a binary mixture or, alternatively, a fluorinated fluorocarbon or chlorinated fluorocarbon.

Figure 4:
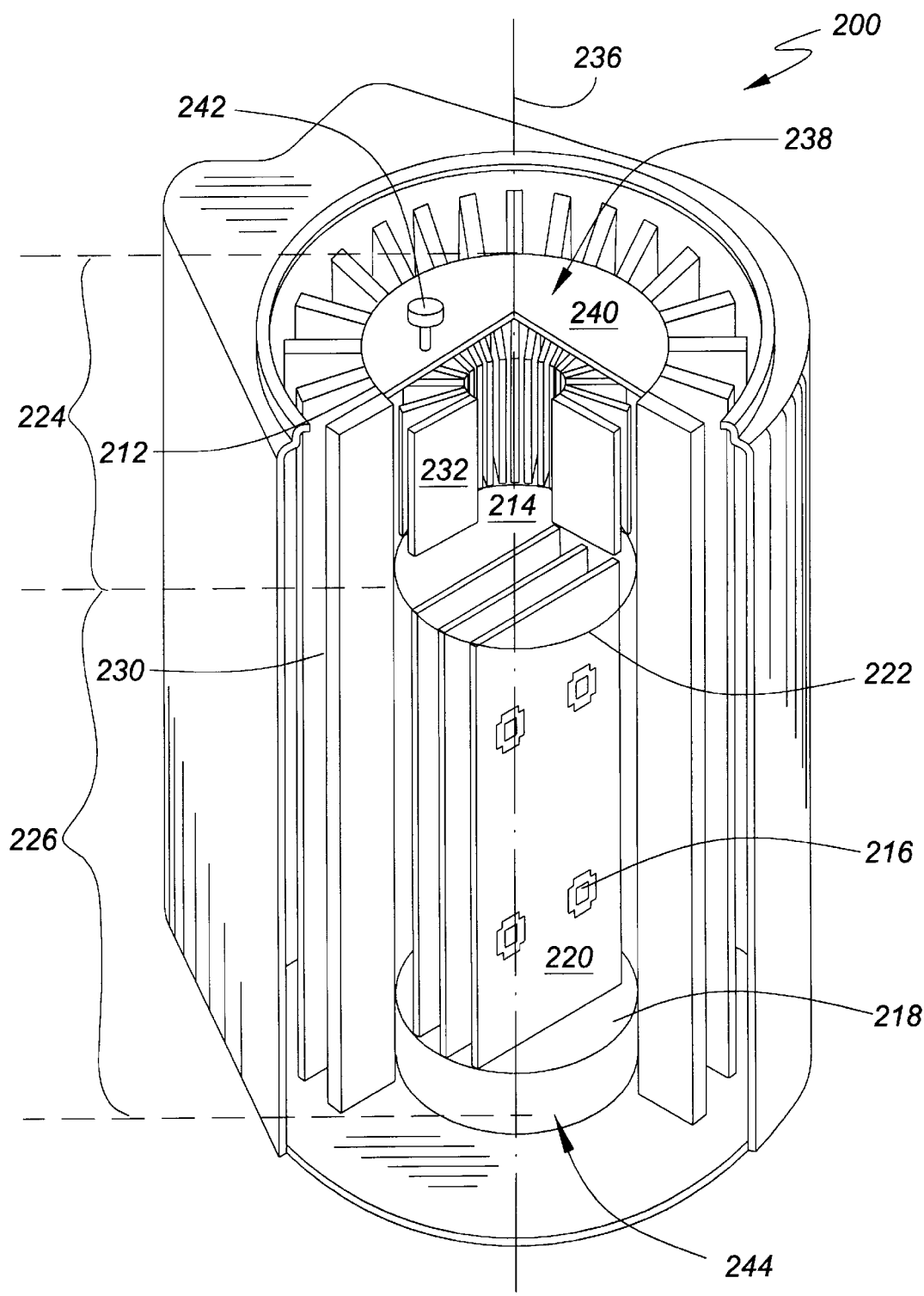
FIG. 4 is a perspective partial cutaway view of a liquid immersion cooling apparatus for electronic components according to a third embodiment of the invention.

A liquid immersion cooling apparatus 200 according to a third embodiment is shown in FIG. 4. The apparatus 200 comprises a cylindrical external shell 212, defining a chamber 214 with a plurality of heat dissipating components 216 disposed within the chamber 214 and surrounded by the shell 212. The components 216 are immersed into a low boiling point dielectric liquid 218 partially filling the chamber. The shell 212 has two portions, an upper portion of the shell 224 adjacent the area above the liquid level 222 which forms a vapor space, and a lower portion of the shell 226 adjacent the liquid. The shell 212 has an external heat transfer structure made in the form of external fins 230 extending outward from the shell and from the chamber, and an internal heat transfer structure made in the form of internal fins 232 extending inward from the shell and into the chamber. Top and bottom ends of the shell, designated in FIG. 3 by numerals 238 and 244 correspondingly, are sealed from ambient atmosphere as described in the first embodiment above. To protect the apparatus 200 from external thermal and solar radiation and pollutants, the shell 212 is surrounded by a cylindrical solar shield 234.

The cylindrical apparatus 200 of the third embodiment, possessing similar advantages as first and second embodiments and allows for lighter and less expensive containment vessel.

Figure 5:
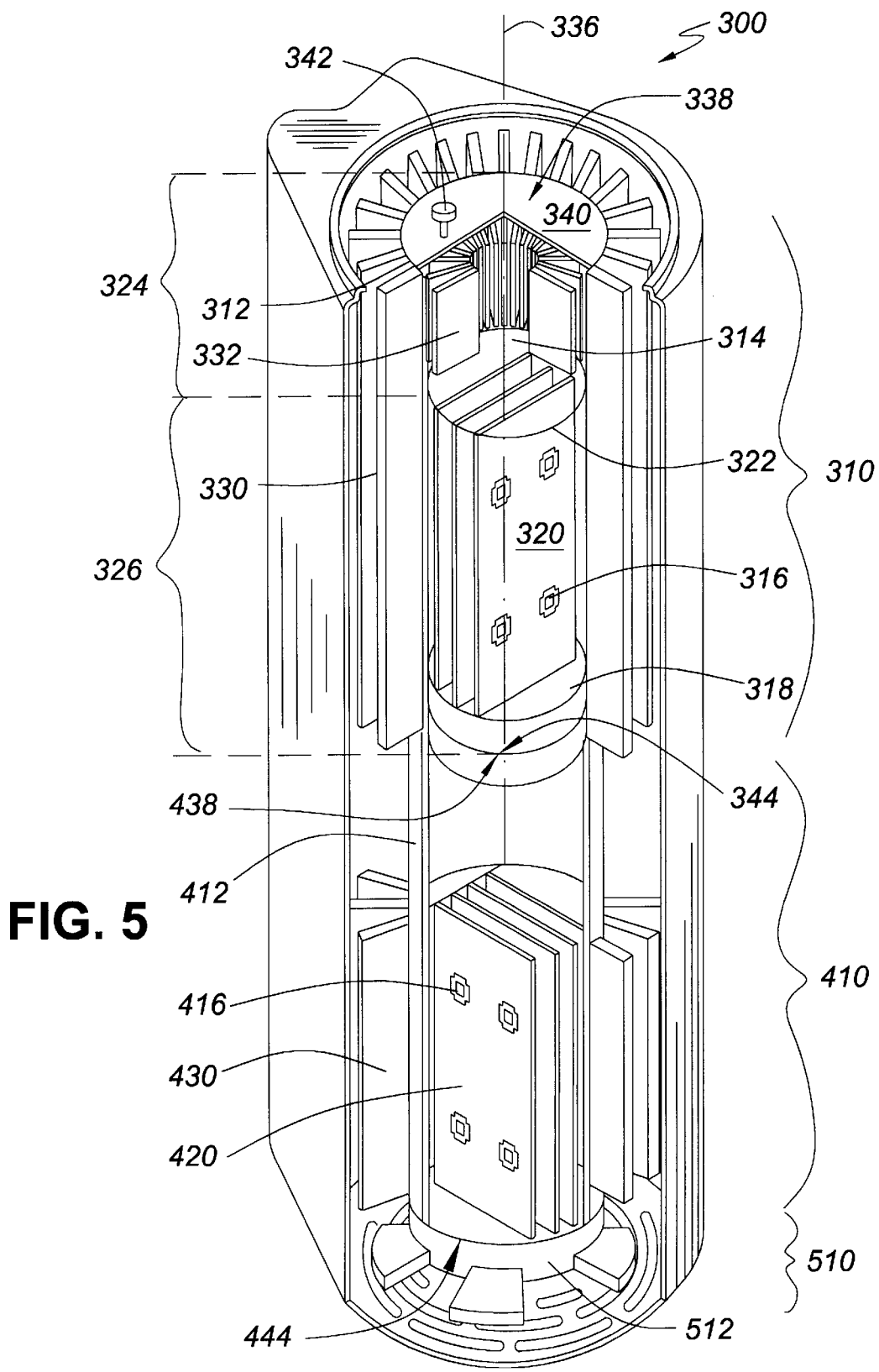
FIG. 5 is a perspective partial cutaway view of an assembly of cooling apparatus employing the liquid immersion cooling apparatus.

FIG. 5 illustrates a cooling assembly 300 employing the liquid immersion cooling apparatus 200 described above. The assembly 300 comprises a main liquid filled, immersion cooling apparatus 310 and additional apparatus which are as follows: the conduction cooling apparatus 410, the forced convection cooling apparatus 510. The elements 310, 410 and 510 are coaxial and surrounded by a solar shield 610.

The structure of the immersion cooling apparatus 310 is similar to the liquid immersion cooling apparatus 10, 100 or 200 according to the first, second or third embodiments correspondingly, depending upon the requirements of the electronic system. By way of example, the apparatus 310 shown in FIG. 5 corresponds to the third embodiment of the invention. It comprises a cylindrical external shell 312, defining a chamber 314 with a plurality of heat dissipating components 316 disposed within the chamber 314 and surrounded by the shell 312. The components 316 are immersed into a low boiling point dielectric liquid 318 partially filling the chamber. The shell 312 has two portions, an upper portion of the shell 324 adjacent the area above the liquid level 322 which forms a vapor space, and a lower portion of the shell 326 adjacent the liquid. The shell 312 has an external heat transfer structure made in the form of external fins 330 extending outward from the shell and from the chamber, and an internal heat transfer structure made in the form of internal fins 332 extending inward from the shell and into the chamber. The external fins 330 of the immersion cooling apparatus 310 may uniformly extend along the entire length of the shell 312 (as shown in FIG. 5), or may extend along the upper portion 324 of the shell 312 only (not shown), or may be designed so as to provide better heat transfer characteristics for the fins extending along the upper portion of the shell, depending on the apparatus requirements. Preferably, the external fins 330 and internal fins 332 of the immersion cooling apparatus are radial fins. Top and bottom ends of the immersion apparatus shell, designated in FIG. 3 by numerals 338 and 344 correspondingly, are sealed from ambient atmosphere as described above.

The conduction cooling apparatus 410 is similar in construction and external appearance to the immersion cooling apparatus 310 with the exception that this apparatus is not filled with liquid. This apparatus is intended to contain lower powered electronics that do not require the extensive thermal management provided by the immersion cooling apparatus. The apparatus 410 comprises a cylindrical external shell 412 defining a chamber 414 with a plurality of heat dissipating components 416 disposed within the chamber 414 and surrounded by the shell 412. The shell 412 has an external heat transfer structure made in the form of external fins 430 extending outward from the shell and from the chamber. Preferably, the external 430 fins of the conduction cooling apparatus are radial fins. Top and bottom ends of the conduction cooling apparatus shell, designated in FIG. 5 by numerals 438 and 444 correspondingly, are sealed from ambient atmosphere. The apparatus 410 is attached directly beneath the immersion cooling apparatus 310 so as the top end of the conduction apparatus 438 is adjacent the bottom end of the immersion apparatus 344. Conveniently, the immersion cooling and convection cooling apparatus are assembled to be coaxial, i.e. main axes of their shells are aligned along the same line, designated by numeral 336 in FIG. 5. Conveniently, the electronic components 416 are mounted upon printed circuit boards 420 which are mounted in edge clamps in the conduction cooling apparatus 410 to create a thermally conductive path to the external shell 412 of the apparatus. The humidity control of the conduction cooling apparatus 410 may be provided using absolute or relative humidity control schemes. Sealing of the conduction cooling apparatus 410 is similar to that of the immersion cooling apparatus 10 of the first embodiment as described above. Additional cable connections between the conduction cooling apparatus 410 and the immersion cooling apparatus 310 are terminated at connectors that are mounted onto the sealed feedthroughs located in the removable cap of the immersion cooling apparatus 310.

The forced convection cooling apparatus 510 is comprised of one or more of fan/motor systems 512 (only one fan is shown in FIG. 5) which are designed to force air vertically upward over the surface of the convection cooling apparatus 410 and the immersion cooling apparatus 310. The apparatus 510 is mounted beneath the conduction apparatus 410 and adjacent the bottom end 444 of the conduction apparatus shell. Conveniently, all three apparatus 310, 410 and 510 are assembled to be coaxial, i.e. main axes of the apparatus are aligned along the same line designated by numeral 336 in FIG. 5. Conveniently, all the apparatus 310, 410 and 510 may have cross-sections of the same diameter. Various fan speed control algorithms may be employed by the apparatus 510 in order to increase the overall thermal management effectiveness of the apparatus 300. The forced convection apparatus 510 is designed to be easily field-replaceable. Additionally, cylindrical design of the apparatus 510 and of the entire assembly 300 provides greater efficiency of convection cooling in comparison with other cross-sectional designs of the corresponding assemblies.

The solar shield 610 surrounds the immersion cooling 310, conduction cooling 410, and forced convection 510 apparatus and shields them from solar radiation and from nearby objects which may be radiating thermal energy. The solar shield 610 has a cylindrical shape and coaxially surrounds the assembly 300. The interior and/or exterior surfaces of the shield 610 may comprise one or more surface coatings in order to alter its solar/thermal radiating characteristics. A mounting bracket (not shown) is attached to the side of the immersion cooling 310, conduction cooling 410, and forced convection 510 cooling apparatus and supports the solar shield 610. The bracket is designed to be attached, for example, to the side of a wall or a pole.

Various combinations and arrangements of components 310, 410 and 510 may be contemplated, for example, in the following manner. The forced convection cooling apparatus 510 may be mounted above the immersion cooling apparatus 310 and adjacent the top end 338 of the immersion apparatus shell (not shown in Figures). Yet alternatively the assembly 300 may comprise a first and a second forced convection cooling apparatus (not shown in Figures), wherein the first convection apparatus is mounted beneath the conduction cooling apparatus 410 and adjacent the bottom end of the conduction apparatus shell 444 and the second convection apparatus is attached above the immersion cooling apparatus 310 and adjacent the top 338 end of the immersion apparatus shell.

Alternatively, other embodiments of the assembly of cooling apparatus (not shown in Figures) may comprise the conduction cooling apparatus 410 mounted above the liquid immersion apparatus 310 so as the bottom end of the conduction apparatus 444 is adjacent the top end of the immersion apparatus 338. The assembly may comprise one forced convection cooling apparatus 510 mounted either above the conduction cooling apparatus 410 and adjacent the top end of the conduction apparatus shell 438 or beneath the immersion cooling apparatus 310 and adjacent the bottom end of immersion apparatus shell 344. Alternatively, the assembly may comprise two forced convection cooling apparatus (not shown), a first and a second forced convection cooling apparatus, wherein the first convection apparatus is mounted above the conduction cooling apparatus 410 and adjacent the top end of the conduction apparatus shell 438 and the second convection apparatus is mounted beneath the immersion cooling apparatus 310 and adjacent the bottom end of immersion apparatus shell 344.

Thus, it will be appreciated that, while specific embodiments of the invention are described in detail above, numerous variations, combinations and modifications of these embodiments fall within the scope of the invention as defined in the following claims.

What is claimed is:

1. A liquid immersion cooling apparatus for electronic components, suitable for operation in thermally uncontrolled environments, comprising:

a shell having upper and lower portions and defining a chamber within the shell having corresponding upper and lower portions;

the lower portion of the chamber containing a low boiling point dielectric liquid partially filling the chamber, the liquid level approximately defining a dividing line between the upper and the lower portions of the chamber and the shell;

the lower portion of the chamber containing a plurality of heat dissipating electronic components being immersed in the liquid;

the shell having an external heat transfer structure extending outwardly from the shell and an internal heat transfer structure extending from the shell into the chamber;

the external heat transfer structure including a side external heat transfer structure provided on a side surface area of the shell, the side external heat transfer structure providing heat transfer from the upper portion of the shell only, thereby ensuring substantially higher efficiency of heat dissipation at high external temperatures than at low external temperatures.

2. A cooling apparatus as defined in claim 1 wherein the external and internal heat transfer structures comprise external and internal fins correspondingly.

3. A cooling apparatus as defined in claim 1 further comprising a solar shield surrounding the apparatus.

4. A cooling apparatus as defined in claim 3, wherein a surface of the solar shield comprises a coating to provide predetermined solar thermal radiating characteristics.

5. A cooling apparatus as defined in claim 1 wherein the low boiling point dielectric liquid is a binary mixture selected to provide an optimum heat flux from the heat generating components with a low pressure build-up within the chamber.

6. A cooling apparatus as defined in claim 1 wherein the low boiling point dielectric liquid is fluorinated fluorocarbon or chlorinated fluorocarbon.

7. A cooling apparatus as defined in claim 2 wherein the internal fins extend along the upper portion of the shell only.

8. A cooling apparatus as defined in claim 2 wherein the shell is cylindrical, having a top and bottom ends corresponding to the upper and the lower portions of the shell respectively, the top end of the shell sealed permanently and hermetically, and the bottom end of the shell sealed semi-permanently with a removable cap providing sealed feedthroughs for cables.

9. A cooling apparatus as defined in claim 8 further comprising a solar shield having a cylindrical shape and coaxially surrounding the apparatus.

10. A cooling apparatus as defined in claim 8 wherein the external and internal fins are radial fins.

11. A liquid immersion cooling apparatus for electronic components, suitable for operation in thermally uncontrolled environments, comprising:

a cylindrical shell having upper and lower portions and defining a chamber within the shell having corresponding upper and lower portions;

the lower portion of the chamber containing a low boiling point dielectric liquid partially filling the chamber, the liquid level approximately defining a dividing line between the upper and the lower portions of the chamber and the shell;

the lower portion of the chamber containing a plurality of heat dissipating electronic components being immersed in the liquid;

the shell having an external heat transfer structure extending outwardly from the shell and an internal heat transfer structure extending from the shell into the chamber;

the external heat transfer structure including a side external heat transfer structure provided on a side surface area of the shell, the side external heat transfer structure providing heat transfer from the upper portion of the shell only, thereby ensuring substantially higher efficiency of heat dissipation at high external temperatures than at low external temperatures;

the shell having top and bottom ends, corresponding to the upper and lower portions of the shell, the ends sealed from ambient atmosphere.

12. A cooling apparatus as defined in claim 11 wherein the external and internal heat transfer structures comprises external and internal fins correspondingly.

13. A cooling apparatus as defined in claim 11 further comprising a solar shield having a cylindrical shape and surrounding the apparatus.

14. An apparatus of claim 1, the apparatus being a part of an assembly of cooling apparatus for electronic systems, suitable for operation in thermally uncontrolled environments.

* * * * *